(12) United States Patent
Mandelkern et al.

(10) Patent No.: US 7,501,631 B2
(45) Date of Patent: Mar. 10, 2009

(54) SHIELDING AN IMAGING ARRAY FROM X-RAY NOISE

(75) Inventors: Stan Mandelkern, Teaneck, NJ (US); David Schick, Kew Garden Hills, NY (US); Barmak Mansoorian, San Diego, CA (US); Daniel Van Blerkom, Altadena, CA (US)

(73) Assignee: Schick Technologies, Inc., Long Island City, NY (US)

( * ) Notice: Subject to any disclaimer, the term of this patent is extended or adjusted under 35 U.S.C. 154(b) by 54 days.

(21) Appl. No.: 11/245,519

(22) Filed: Oct. 7, 2005

(65) Prior Publication Data

US 2007/0080300 A1    Apr. 12, 2007

(51) Int. Cl.
*G01T 1/20* (2006.01)
(52) U.S. Cl. .............................. 250/361 R; 250/370.11
(58) Field of Classification Search ............ 250/370.11, 250/370.09, 361 R, 363.02
See application file for complete search history.

(56) References Cited

U.S. PATENT DOCUMENTS

| | | | | |
|---|---|---|---|---|
| 4,725,873 A * | 2/1988 | Nishizawa et al. | ........... | 257/258 |
| H000569 H * | 1/1989 | Varker et al. | ................ | 257/297 |
| 5,010,381 A * | 4/1991 | Shiba | .......................... | 257/184 |
| 5,912,942 A | 6/1999 | Schick et al. | ............... | 378/98.8 |
| 6,225,670 B1 | 5/2001 | Dierickx | ....................... | 257/431 |
| 6,323,490 B1 | 11/2001 | Ikeda et al. | ............ | 250/370.09 |
| 6,362,484 B1 | 3/2002 | Beyne et al. | ................. | 250/374 |
| 6,559,452 B1 | 5/2003 | Tashiro | ................... | 250/370.09 |
| 6,657,178 B2 | 12/2003 | Aebi | ........................... | 250/214 |
| 6,667,481 B2 | 12/2003 | Teranuma et al. | ...... | 250/370.09 |
| 6,690,074 B1 | 2/2004 | Dierickx et al. | ............. | 257/398 |
| 6,784,436 B2 | 8/2004 | Francke | .................... | 250/385.1 |
| 6,823,044 B2 | 11/2004 | Rosner | ....................... | 378/98.8 |
| 6,895,077 B2 | 5/2005 | Karellas et al. | ............. | 378/98.3 |
| 7,362,846 B2 | 4/2008 | Kerschner | ..................... | 378/19 |
| 2003/0227998 A1 | 12/2003 | Liao | .......................... | 378/98.8 |
| 2005/0017189 A1 | 1/2005 | Homma et al. | ......... | 250/370.11 |
| 2005/0156099 A1 * | 7/2005 | Hehemann et al. | ....... | 250/208.1 |

OTHER PUBLICATIONS

Lyon et al., "Eyeing the Camera: Into the Next Century", Tenth Color Imaging Conference: Color Science and Engineering Systems, Technologies, Applications, pp. 349-355, Scottsdale, AZ, Nov. 12, 2002.

* cited by examiner

*Primary Examiner*—David P Porta
*Assistant Examiner*—Carolyn Igyarto
(74) *Attorney, Agent, or Firm*—Fitzpatrick, Cella, Harper & Scinto

(57) ABSTRACT

An electronic imaging sensor, which has an improved immunity to noise caused by unwanted x-rays, images an object by collecting charge carriers produced in the sensor when the object is exposed to x-rays. One or more shielding areas are formed proximate the sensor to capture or sweep away any undesirable charge carriers generated by the unwanted x-rays. The shielding areas extend deeper beneath the surface of the sensor than the depth at which the desired charge carriers corresponding to the object being imaged is collected. The shielding areas capture charge carriers formed by the unwanted x-rays, which penetrate into the sensor to a greater depth than the depth at which the. desired charge carriers are collected. In this way, the undesirable charge carriers are captured near the region where they are generated and before they migrate towards the surface where they can be collected and manifest as noise in the resulting image of the object.

9 Claims, 2 Drawing Sheets

SHIELDING AN IMAGING ARRAY FROM X-RAY NOISE

BACKGROUND OF THE INVENTION

1. Field of the Invention

The present invention relates generally to the field of radiation-sensitive imaging devices, and more specifically to radiation-sensitive imaging devices that have improved immunity to x-ray noise.

2. Related Background Art

Increasingly, electronic imaging sensors have been replacing film-based sensors in commercial, industrial, and medical imaging applications. Examples of such electronic sensors include charge-coupled device (CCD) sensors and complementary metallic-oxide-semiconductor (CMOS) sensors, to name a few. CMOS sensors, in particular, have emerged as a preferred candidate due to advantages in manufacturing cost, integration of components, charge efficiency, and low power consumption. An excellent example of a detector system suitable for medical imaging applications that uses a CMOS active pixel sensor (APS) array is provided in U.S. Pat. No. 5,912,942 to David B. Schick et al., assigned to the assignee of the present patent application. The Schick '942 patent is incorporated herein by reference.

In the system of the Schick '942 patent, as in many medical imaging applications, radiation or energy from x-ray photons, commonly referred to as x-rays, is projected through a patient and must be registered or detected by a sensor. However, conventional sensors or imaging chips, which generally are fabricated from silicon, are considerably more sensitive to photon energy in the visible spectrum than to x-rays. Thus, a scintillator is disposed on the sensors to convert the energy from the x-rays to visible light. The scintillator is typically composed of gadolinium oxysulphide or cesium iodide, although other alternative materials may be used.

While it is desirous that the scintillator convert all of the x-rays to visible light, in practice only a percentage is actually converted, with the remaining x-rays passing through the scintillator and reaching the silicon. A typical gadolinium oxysulphide scintillator, for example, may have a so-called stopping efficiency of 20-30%, meaning that only 20-30% of the x-rays that impinge on the scintillator are converted to visible light, with a significant amount of the x-rays (some 70-80%) being transmitted through the scintillator into the surface of the sensor. Although the sensor may be designed to be primarily sensitive to visible light, it will nevertheless be secondarily sensitive to effects from the transmitted x-rays. As a result, the transmitted x-rays are registered as noise by the sensor, reducing the overall quality of the captured image.

To reduce such noise, conventional systems typically shield the sensor from transmitted (unconverted) x-rays. In the Schick '942 patent, for example, such shielding is achieved by interposing a fiber-optic plate (FOP) between the scintillator and the sensor. The FOP allows light to pass, but blocks (i.e., absorbs) a large amount of the unconverted x-rays. While generally good for its intended application, this shielding approach has the drawback of adding an undesirable thickness to the sensor, which compromises patient comfort. FOPs also cause some degree of light signal loss and light spreading, each of which reduces image quality. Also, as FOP sizes increase, they become extremely expensive and fragile. Accordingly, for many reasons, it is desirable to avoid using FOPs.

Recently, advanced x-ray-sensitive photoconductive materials, such as selenium, lead iodide ($PbI_2$), and mercuric iodide ($HgI_2$), for example, have allowed designers to produce sensors that can image x-rays directly, so that a conventional scintillator is not needed. When x-rays strike the surface of such a photoconductive material, electron-hole pairs are formed. These charges are driven by an electrical potential or bias potential, which causes charges of a selected polarity to be collected by a storage element, such as a capacitor. This alternative design has the benefit of limiting light-spreading, and may achieve preferred spatial resolution as compared to typical scintillators. However, although these photoconductive materials have superior stopping or conversion efficiency, their efficiency nevertheless is imperfect. And of course, because x-rays are directly imaged, an FOP generally is not used in these arrangements. Accordingly, with these constructions as well, an improved x-ray noise immunity is desirable.

Other structures for providing radiation shielding have been proposed. For example, U.S. Pat. No. 6,690,074 B1 to Dierickx is aimed at providing a radiation-resistant semiconductor device, and is particularly concerned with reducing the leakage current between the source and drain electrodes in a MOS-type structure, resulting from an overlap between the gate electrode and the field oxide. Towards this end, the Dierickx device uses a doped guard ring interrupted by an active area. This approach, however, while perhaps adequate for its intended purpose of preventing or reducing leakage currents, which typically occur near the surface of semiconductor devices, is completely ineffective at shielding from the deleterious effects of unconverted x-rays, which usually occur well below the surface.

There is a great need, therefore, for a semiconductor x-ray imaging chip that takes an entirely fresh approach, and provides improved x-ray noise immunity, and at the same time a superior image quality.

SUMMARY OF THE INVENTION

The present invention addresses the deficiencies in the prior art by providing arrangements and designs of an electronic imaging sensor or device with an improved immunity to noise caused by unwanted x-rays. The sensor images an object by collecting charge carriers produced in the sensor when the object is exposed to radiation such as x-rays. The charge carriers may be generated indirectly by the radiation, such as with the use of a scintillator to convert x-rays into visible light, with a photocurrent produced by the visible light being used to create an image of the object. Alternatively, the charge carriers may be generated directly by the radiation, such as with the use of selenium or other types x-ray-sensitive photoconductive materials that enable a photocurrent to be generated directly from exposure to x-rays.

One or more shielding areas are formed proximate the sensor, to capture or sweep away any undesirable charge carriers generated by stray or undesired radiation. The shielding areas extend deeper beneath the surface of the sensor than the depth at which the photocurrent corresponding to the object being imaged ("the desired photocurrent") is collected. This is because the undesirable charge carriers are formed deeper beneath the surface of the sensor. Typically, the undesired charge carriers are generated by, for example, unconverted x-rays or x-rays that are not absorbed by the x-ray-sensitive photoconductive material, which penetrate into the sensor to a greater depth than the depth at which the desired photocurrent is collected. In this way, the undesirable charge carriers are captured near the region where they are generated and before they migrate towards the surface where they can be collected and manifest as noise in the resulting image of the object.

According to an aspect of the invention, a radiation detector is provided that possesses an improved immunity to x-ray noise over conventional radiation detectors. The inventive radiation detector includes:

a scintillator that converts radiation of a first energy to radiation of a second energy;

a semiconductor substrate incorporating dopants of a first conductivity type;

a sensing region formed in the substrate and incorporating dopants of a second conductivity type, wherein a sensing junction located at an interface between the sensing region and the substrate and positioned at a first depth below a surface of the substrate collects charge carriers generated in the substrate by the radiation of the second energy; and a shielding region formed in the substrate and incorporating dopants of the second conductivity type, wherein a shielding junction located at an interface between the shielding region and the substrate and positioned at a deeper depth below the surface of the substrate than the first depth collects charge carriers generated in the substrate by radiation of the first energy.

According to another aspect of the present invention, a radiation detector is provided that possesses an improved immunity to x-ray noise over conventional radiation detectors, and that utilizes a photocurrent generated directly from x-rays. The inventive radiation detector includes:

a photoconductive portion that generates charge carriers when irradiated with x-rays;

a semiconductor substrate incorporating dopants of a first conductivity type;

a sensing region positioned at a first depth below a surface of the substrate to collect the charge carriers generated in the photoconductive portion;

a shielding portion formed in the substrate and incorporating dopants of a second conductivity type, wherein a shielding junction located at an interface between the shielding portion and the substrate and positioned at a second depth that is deeper below the surface of the substrate than the first depth collects charge carriers generated in the substrate by stray x-rays that pass through the photoconductive portion into the substrate.

BRIEF DESCRIPTION OF THE DRAWINGS

The present invention will be better understood by a study of the detailed description presented below considered in conjunction with the attached drawings, of which.

It is to be understood that the attached drawings are intended to schematically illustrate various aspects of the present invention and may not be rendered to scale.

DETAILED DESCRIPTION OF THE INVENTION

In an embodiment of the present invention, the inventive shielding arrangement is incorporated within a photosensitive CMOS sensor containing an array of pixels. Each pixel includes a photodiode with a p-n junction in a semiconductor substrate. The photodiode capacitance is biased to a known or pre-set voltage and, during exposure of the photodiode to photons, such as when an image is being captured, electron-hole pairs are formed in the substrate in proportion to the intensity of the photons. The electron-hole pairs give rise to a photocurrent at the p-n junction, resulting from charge carriers of the electron-hole pairs migrating through the substrate and reaching the p-n junction. The photocurrent causes a change in the voltage of the photodiode, and the voltage is read out to obtain image data for that pixel. Image data corresponding to multiple pixels are used to construct a captured image.

Figure 1:
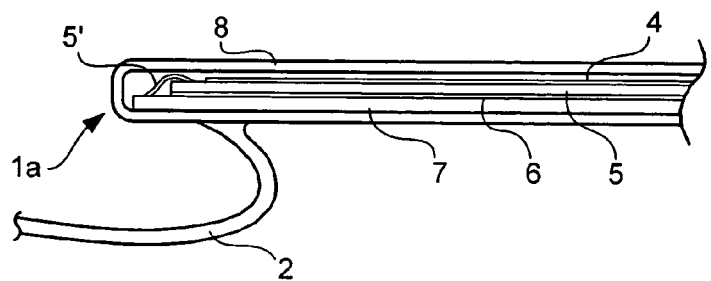
FIG. 1 shows a cross-sectional view of a radiation detector or sensor, according to an embodiment of the present invention.

FIG. 1 is a magnified cross-sectional view of an electronic detector or sensor 1a for capturing an image by detecting radiation, according to the embodiment of the present invention. As shown in FIG. 1, the sensor 1a includes a scintillator 4 disposed above a semiconductor 5, which is disposed above a tungsten layer 6. The scintillator 4, the semiconductor 5, and the tungsten layer are supported on a passivated ceramic substrate 7. In general terms, the scintillator 4 converts high-energy radiation, such as x-rays, to lower-energy radiation, such as visible light. The semiconductor 5, in turn, converts the lower-energy radiation into electrical signals corresponding to image data representing the captured image. The tungsten layer 6 absorbs any x-rays not converted by the scintillator 4, to prevent those unconverted x-rays from impinging on the patient, and absorbs any backscattered radiation. The semiconductor 5 includes a CMOS APS array. According to an aspect of the present invention, the image data produced by the semiconductor 5 is conveyed to a cable 2 via a conductive lead 5'. The conductive lead 5' also may be used to convey electrical power and/or control signals from a computer to the semiconductor 5. According to another aspect of the present invention, image data and control signals are exchanged wirelessly, and in such a case the cable 2 may be eliminated. The entire sensor 1a is enclosed in a radiation housing 8, which protects the sensor 1a from shock and enables the sensor 1a to be moisture resistant, and which is transparent to x-rays.

The scintillator 4 is interposed between an x-ray source (not shown) and the semiconductor 5, to both protect the semiconductor 5 from unwanted exposure to x-rays and to convert the x-rays to visible light, which can be directly detected by the semiconductor 5. According to an aspect of the present invention, the scintillator 4 is composed of gadolinium oxysulphate ($Gd_2SO_5$) or thallium-doped cesium iodide (CsI(Tl)). Each of these materials is sensitive to x-ray photons, and efficiently converts them into visible photons in the 500-600 µm wavelength range. Other x-ray-to-light converting materials that may be used for the scintillator 4 include: cadmium telluride; cadmium sulfide; calcium tungstate ($CaWO_4$); zinc sulfide; and zinc cadmium sulfide. Scintillating glass, such as for example terbium glass, or scintillating optical fibers may also be used for the scintillator 4.

In some types of x-ray imaging, as discussed above, x-rays are first converted into visible light by the scintillator 4. According to an aspect of the present invention, the scintillator 4 is formed of a material that converts x-rays to light to be collected by the pixels in the APS array. However, as also discussed above, the scintillator 4 will not convert 100% of the x-rays that it receives; some x-rays inevitably will pass through the scintillator 4 unconverted. Such unconverted x-rays can cause a very large local charge to be generated in the sensor 1a, which, if registered or collected by a pixel, can create noise and dark spots in the resultant image.

For the purposes of the present discussion, the structure and operation of a single pixel of the array of pixels is described below. Adaptation of the below description to the entire array of pixels is within the realm of a person of ordinary skill in imaging device technology and therefore will not be discussed further.

In seeking to improve the x-ray noise immunity of a semiconductor imaging chip or sensor, the present inventors observed and exploited the phenomenon that energy from x-ray photons is absorbed deeper in semiconductor material than energy from visible light photons. The present invention exploits this phenomenon to improve x-ray noise immunity by adding structure to the semiconductor material of the sensor to redirect the electron-hole pairs that are formed from x-ray photons absorbed deep in the semiconductor material, thus preventing those electron-hole pairs from being detected while allowing the electron-hole pairs that are generated near the surface of the semiconductor material to be detected, thereby providing a highly effective shielding from x-ray noise.

Figure 2:
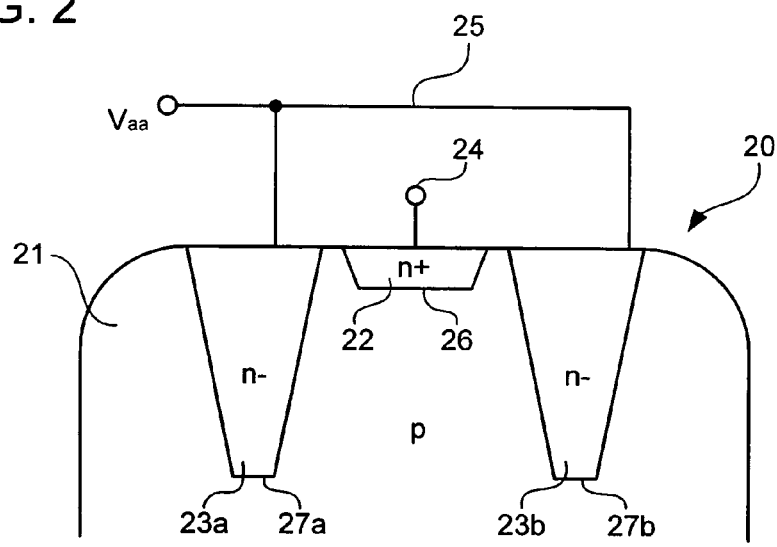
FIG. 2 shows, in cross section, an arrangement of a radiation detector that utilizes n-type regions in a p-type substrate, according to an embodiment of the present invention.

An illustrative example of an aspect of the present invention is provided in FIG. 2, which schematically shows a simple illustration of a pixel 20 in a radiation sensor. The pixel 20 includes a photodiode consisting of a p-n junction 26 formed of an n-type sensing region 22 in a p-type substrate or bulk region 21. The sensing region 22 may be formed by known techniques, such as, for example, ion implantation or diffusion of n-type dopants into the bulk region 21. According to a preferred embodiment, the bulk region 21 is formed of silicon, although other semiconductor materials may be used and are within the scope of the present invention. Preferably, the sensing region 22 is formed by ion implantation and is heavily doped n-type (n+). The bulk region 21 may be comprised of, for example, silicon that is doped p-type according to any of a number of techniques well known in the art.

Prior to exposure to radiation, the photodiode is biased or charged to a pre-set operating voltage. For example a voltage of 2 V may be used, although any biasing voltage sufficient for holes to overcome the barrier voltage established by the p-n junction is sufficient. When photons of visible light impinge on the pixel 20, energy from the photons generate electron-hole pairs in the bulk region 21. Positively charged holes from the electron-hole pairs migrate through the bulk region 21 and, when the holes reach the p-n junction 26, a photocurrent is produced, thus changing the voltage of the photodiode.

That voltage change is representative of the captured image at the location of the pixel 20. Following exposure to the photons of visible light, the voltage of the pixel 20 is read out via a line 24 to obtain image data for the pixel 20, and this data may be used and combined with data from other pixels to construct the captured image.

Also formed in the bulk region 21 are two n-type shielding regions 23a, 23b. As schematically shown in FIG. 2, the shielding regions 23a, 23b extend deeper into the bulk region 21 than does the sensing region 22 (although their respective depths are not necessarily illustrated to scale). The shielding regions 23a, 23b form p-n junctions 27a, 27b with the bulk region 21 such that, when radiation is incident on the sensor 20, electron-hole pairs generated near the surface of the sensor 20 are detected through a voltage change at the sensing region 22, while the electron-hole pairs generated deeper in the bulk region 21, such as those generated by unconverted x-rays, migrate to the shielding regions 23a, 23b and therefore are not detected or sensed at the sensing region 22. In this manner, charge carriers from electron-hole pairs corresponding to the captured image are detected and charge carriers from electron-hole pairs formed by unwanted x-rays are not detected. The shielding regions 23a, 23b are formed by known techniques such as, for example, ion implantation. Preferably, the shielding regions 23a, 23b are lightly doped (n−) relative to the sensing region 22.

Optionally, instead of the two shielding regions 23a, 23b, a single shielding or more than two shielding regions may be used in the sensor 20.

While the embodiment discussed above refers to the bulk region 21 or substrate as being p-type and refers to the sensing region 22 and the shielding regions as being n-type, the present invention may be implemented in other configurations. For example, p-type sensing and shielding regions may be formed in an n-type substrate or bulk region. The latter configuration can be accomplished by forming an n-type epitaxial layer on top of a p-type substrate or bulk region, and then forming p-type sensing and shielding regions in the epitaxial layer.

Figure 3:
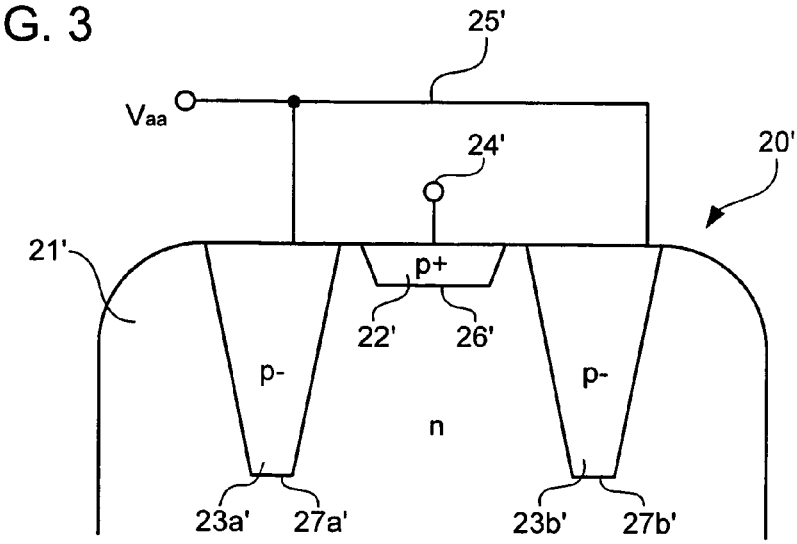
FIG. 3 shows, in cross section, an arrangement of a radiation detector that utilizes p-type regions in an n-type substrate, according to an embodiment of the present invention.

FIG. 3 schematically shows a simple illustration of a pixel 20' in a radiation sensor, in which the polarity of the various regions of the pixel 20' are opposite to the polarities of the various regions in the pixel 20 of FIG. 2. The pixel 20' includes a photodiode consisting of a p-n junction 26' formed of a p-type sensing region 22' in an n-type substrate or bulk region 21'. Also formed in the bulk region 21' are two p-type shielding regions 23a', 23b', which extend deeper into the bulk region 21' than does the sensing region 22' (although their respective depths are not necessarily illustrated to scale). The shielding regions 23a', 23b' form p-n junctions 27a', 27b' with the bulk region 21'.

The specific depths of the sensing region 22 (22') and the shielding regions 23a, 23b (23a', 23b'), i.e., the specific depths of the p-n junctions 26, 27a, 27b (26', 27a', 27b') are dependent on the nature and characteristics of the x-ray source. In a photosensitive CMOS APS sensor, the p-n junctions 27a, 27b (27a', 27b') of the shielding regions 23a, 23b (23a', 23b') preferably are formed at a depth that is greater than the penetration depth of light emitted by the scintillator 4. More specifically, scintillators fluoresce at a characteristic wavelength corresponding to the color of the emitted light, such as light in the blue-green portion of the visible-light spectrum. By forming the shielding regions 23a, 23b (23a', 23b') such that their p-n junctions 27a, 27b(26a', 27b') are positioned deeper in the bulk region 21 (21') than the depth to which light generated by the scintillator 4 penetrates, the shielding regions 23a, 23b (23a', 23b') effectively function to capture unwanted charge carriers from electron-hole pairs that are generated deep in the bulk region 21 (21 ') by x-rays that pass through the scintillator 4 without being converted to visible light. The shielding regions 23a, 23b (23a', 23b'), however, do not significantly affect the charge carriers from electron-hole pairs generated by the visible light from the scintillator 4, because these charge carriers are generated at a relatively shallower depth in the bulk region 21 (21'). Thus, charge carriers generated by the unconverted x-rays, which if left to migrate to the p-n junction 26 (26') of the sensing region 22 (22') would result in noise in the captured image, are prevented from being detected by the sensing region 22 (22').

Optionally, a line 25 (25') may be use to apply a bias voltage to the shielding regions 23a, 23b (23a', 23b').

In a preferred embodiment of the present invention, intended for typical x-ray dental imaging applications, the sensing region 22 (22') is formed such that the p-n junction 26 (26') occurs at a depth of about 0.2 microns, while the shielding regions 23a, 23b (23a', 23b') are formed such that the p-n junctions 27a, 27b (27a', 27b') occur at a depth of about 4.5 microns, with the ratio of the two depths being about 1:20. These depths and the depth ratio, however, are exemplary only, and other depths and ratios are possible and within the scope of the present invention.

In another embodiment of the present invention, a pixel of a photoconductive sensor includes one or more shielding regions, such as those discussed above. However, instead of using a scintillator to convert x-rays to visible light, the sensor uses an x-ray-sensitive photoconductive material, such as selenium, $PbI_2$, or $HgI_2$, which directly converts x-rays to charge carriers, which in turn produces an electrical signal. Optionally, in such a sensor, the photodiode of the embodiment described above is replaced by a capacitor, which is used to read out the charge generated in the photoconductive material. In this case, the gate of a read-out transistor is connected to a "floating" (capacitive) node whose capacitance operates in a manner similar to the photodiode capacitance discussed above.

Such a sensor also is similarly sensitive to spurious charge carriers formed deep in the bulk region of the sensor and generated by x-rays that penetrate beyond the photoconductive material (i.e., are not absorbed by the photoconductive material). By including shielding regions in the sensor, such as the shielding regions described above, sensitive charge-integration nodes in the pixel are shielded from the spurious charge carriers.

A manifestation of the shielding arrangement of the present invention is that a portion of the image signal may be diverted to the shielding region(s) rather than to sensing region (or the capacitive node). There is therefore a natural trade-off between the loss of intended signal versus the desired shielding from noise caused by unwanted x-rays. Depending upon the particular case, it may be preferable to form an n-well that only partially surrounds the node. By varying the geometry and the size of the shielding region(s), an optimal image signal may be achieved. For example, the sensing region (or the capacitive node) may be designed to have a surface area that has a fixed proportion with respect to the shielding region(s).

As mentioned above, the Schick '942 patent provides an excellent example of a CMOS APS array for an x-ray sensor. The x-ray sensor of the present invention has a number of differences over the x-ray sensor of the '942 patent. For the x-ray sensor of the '942 patent, the photodiode is formed in a relatively shallow n-well or p-well, such that the detected signal comes from charge carriers in the well. This shallow-well arrangement is based on the principle that the desired signal comes from energy absorbed in the thin depletion region near the surface of the photodiode. Typically, the doping levels in the photodiode are such that there is a high capacitance per unit area, which reduces its conversion gain.

The shallow-well arrangement of the Schick '942 patent is effective in blocking out unwanted charge carriers that diffuse from the substrate. However, this arrangement also results in a significant amount of desirable charge carriers being lost to the junction between the well and the substrate instead of being collected as part of the detected signal. This reduces the responsivity of the photodiode.

In short, the shallow-well arrangement provides excellent shielding from x-ray noise and cross talk, but suffers from a low responsivity.

For the x-ray sensor of the present invention, the photodiode is formed in the substrate or in an epitaxial layer formed on the substrate. This arrangement does not shield as well against x-ray noise and cross talk, compared with the arrangement described in the Schick '942 patent, but instead is able to collect a greater amount of desirable charge carriers and thus provide a better responsivity. Incorporation of the shielding region(s) in the x-ray sensor of the present invention reduces the amount of x-ray noise in the detected signal by removing some of the unwanted charge carriers generated deep in the substrate.

The photodiode arrangement of the present invention allows for collection of desirable charge carriers that are present beyond (below) the depletion region, by not confining the sensing region to within a shallow well, as in the Schick '942 patent. That is, the sensing region can extend deeper into the substrate than in the arrangement of the '942 patent, and can be doped to a lower level than in the arrangement of the '942 patent. This results in a lower capacitance per unit area and a higher conversion gain of the photodiode arrangement of the present invention.

The invention may be useful in a variety of applications, such as intra-oral and large-area medical x-ray applications. In dentistry, for instance, an FOP is commonly used to filter out unconverted x-rays while directing light generated by a scintillator onto a photosensitive array. The addition of an FOP, however, adds to the overall sensor thickness and sensor weight, and can result in a sensor that is uncomfortable for the patient, which may then limit the medical practitioner's ability to correctly position the sensor in the patient's mouth. By using a shielding arrangement according to the present invention, the need for a thick and heavy FOP is obviated. Further, the use of a scintillator may be obviated by using an x-ray-sensitive photoconductive material that allows for the direct imaging of x-rays.

The present invention also is applicable to large-area medical x-ray applications. Large format x-ray detectors may be fabricated as large as 17"×17". A suitable large-area FOP is extremely expensive and fragile, as mentioned above, and the inventive shielding arrangement eliminates the need for an FOP and provides a cost-effective alternative approach to shield against the effects of unwanted x-rays over a large area.

Figure 4:
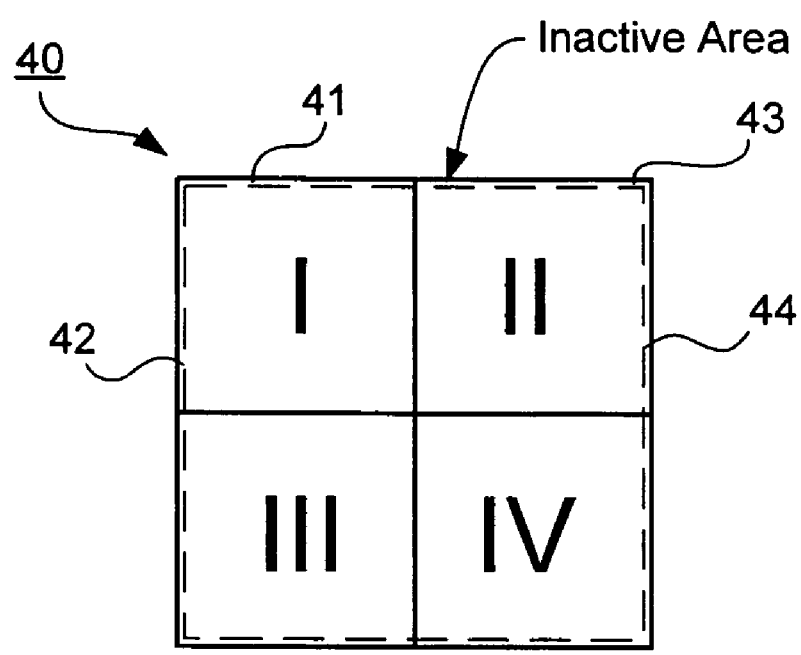
FIG. 4 shows an arrangement of a large-area radiation detector, according to an embodiment of the present invention.

In a preferred embodiment, four wafer-scale CMOS dies are butted together, end to end, to form a large-area detector 40 of approximately 8"×10" in size, as schematically shown in FIG. 4 as dies I, II, III, and IV. Each die has two inactive regions on adjacent sides that do not detect radiation (e.g., die I has adjacent sides 41, 42 that do not detect radiation; die II has adjacent sides 43, 44 that do not detect radiation; etc.). The other two adjacent sides are adjoined to neighboring die. The array is designed and manufactured so that pixels on adjacent sides are approximately within two pixels of each other. To accommodate the geometry, a left-sided and right-sided design are both required. The aforementioned x-ray shielding routine allows the system to be fabricated without a fiber optic plate, which would otherwise add significant overall cost and fragility, as mentioned above.

The present invention has been described through the use of illustrative examples. It is to be understood that the scope of the present invention is not limited to the examples described herein, and other structures or arrangements are encompassed by this invention.

What is claimed is:

1. A radiation detector, comprising:
   a semiconductor substrate incorporating dopants of a first conductivity type;
   a scintillator that converts radiation of a first energy to radiation of a second energy, the radiation of the second energy penetrating into the substrate to a depth no deeper than a first penetration depth;
   a sensing region formed in the substrate and incorporating dopants of a second conductivity type, wherein a sensing junction located at an interface between the sensing region and the substrate, and positioned at a depth below a surface of the substrate that is no deeper than the first penetration depth, collects charge carriers generated in the substrate by the radiation of the second energy;

a shielding region formed in the substrate to shield the sensing region from unconverted radiation of the first energy and incorporating dopants of the second conductivity type, wherein a shielding junction located at an interface between the shielding region and the substrate, and positioned at a depth below the surface of the substrate that is deeper than the first penetration depth, collects charge carriers generated in the substrate by unconverted radiation of the first energy.

2. A radiation detector according to claim 1, wherein the radiation of the first energy is x-ray radiation, and wherein the radiation of the second energy is visible light radiation.

3. A radiation detector according to claim 1, further comprising a plurality of shielding regions arranged around the sensing region.

4. A radiation detector according to claim 1, wherein the scintillator is comprised of gadolinium oxysulphate or thallium-doped cesium iodide.

5. A radiation detector according to claim 1, wherein the unconverted radiation of the first energy penetrates into the substrate to a penetration depth greater than the first penetration depth.

6. A radiation detector according to claim 5, wherein the depth of the sensing junction correlates substantially with the first penetration depth, and wherein the depth of the shielding junction correlates substantially with the penetration depth of the unconverted radiation of the first energy.

7. A radiation detector according to claim 1, wherein the radiation detector is incorporated in a dental imaging device.

8. A radiation detector according to claim 1, wherein the radiation detector is incorporated in a medical imaging device.

9. A radiation detector, comprising:

semiconductor substrate means incorporating dopants of a first conductivity type;

scintillation means for convening radiation of a first energy to radiation of a second energy, the radiation of the second energy penetrating into the substrate to a depth no deeper than a first penetration depth;

sensing means for collecting charge carriers generated in the substrate means by the radiation of the second energy, wherein the sensing means incorporates dopants of a second conductivity type and is formed in the substrate means such that an interface between the sensing means and the substrate means is positioned at a first depth below a surface of the substrate means that is no deeper than the first penetration depth;

shielding means for collecting charge carriers generated in the substrate means by unconvened radiation of the first energy, wherein the shielding means shields the sensing means from unconvened radiation of the first energy and incorporates dopants of the second conductivity type and is formed in the substrate means such that an interface between the shielding means and the substrate means is positioned at a depth below the surface of the substrate means that is deeper than the first penetration depth.

* * * * *